US011355656B2

(12) United States Patent
Hsu et al.

(10) Patent No.: US 11,355,656 B2
(45) Date of Patent: Jun. 7, 2022

(54) PHOTOSENSITIVE MODULE

(71) Applicant: TDK TAIWAN CORP., Taoyuan (TW)

(72) Inventors: Chen-Er Hsu, Taoyuan (TW);
Sin-Jhong Song, Taoyuan (TW);
Chi-Fu Wu, Taoyuan (TW); Hao-Yu Wu, Taoyuan (TW); Tsutomu Fukai, Taoyuan (TW); Ming-Hung Wu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 97 days.

(21) Appl. No.: 16/851,808

(22) Filed: Apr. 17, 2020

(65) Prior Publication Data

US 2020/0335539 A1 Oct. 22, 2020

Related U.S. Application Data

(60) Provisional application No. 62/836,405, filed on Apr. 19, 2019.

(51) Int. Cl.
*A61B 5/11* (2006.01)
*A61B 5/103* (2006.01)
*A61B 5/00* (2006.01)
*H01L 31/0232* (2014.01)
*H01L 31/113* (2006.01)
(Continued)

(52) U.S. Cl.
CPC ........ *H01L 31/02327* (2013.01); *G02B 7/003* (2013.01); *G02B 7/09* (2013.01); *G02B 7/1821* (2013.01); *G02B 27/646* (2013.01); *G03B 5/00* (2013.01); *G03B 5/02* (2013.01); *G03B 5/04* (2013.01); *G03B 13/36* (2013.01);

*H01L 27/14618* (2013.01); *H01L 27/14636* (2013.01); *H01L 31/02002* (2013.01); *H01L 31/024* (2013.01); *H01L 31/02016* (2013.01); *H01L 31/02366* (2013.01); *H01L 31/022466* (2013.01); *H01L 31/1136* (2013.01); *H02K 11/21* (2016.01); *H02K 41/0356* (2013.01); *H04N 5/2253* (2013.01); *H04N 5/2254* (2013.01); *H04N 5/2257* (2013.01); *G02B 13/0045* (2013.01); *G03B 2205/0007* (2013.01); *G03B 2205/0069* (2013.01); *H01L 24/48* (2013.01); *H01L 2224/48091* (2013.01);
(Continued)

(58) Field of Classification Search
CPC .................................................. H01L 27/1464
See application file for complete search history.

(56) References Cited

U.S. PATENT DOCUMENTS

2021/0028210 A1* 1/2021 Okamoto ............... G03B 17/02
2021/0057479 A1* 2/2021 Mizuta .................. H01L 27/146

* cited by examiner

*Primary Examiner* — Kenneth Parker
*Assistant Examiner* — Long H Le
(74) *Attorney, Agent, or Firm* — Muncy, Geissler, Olds & Lowe, P.C.

(57) ABSTRACT

A photosensitive module is provided. The photosensitive module includes a base, an integrated package substrate, and a photosensitive element. The integrated package substrate is connected to the base. The integrated package substrate has a plurality of first electronic components, and the first electronic components are housed inside the integrated package substrate without being exposed to external environment. The photosensitive element is connected to the base, and the photosensitive element is configured to receive a light beam traveling along an optical axis.

13 Claims, 5 Drawing Sheets

(51) Int. Cl.
    *H01L 31/0236*    (2006.01)
    *H01L 31/02*       (2006.01)
    *H01L 27/146*     (2006.01)
    *H01L 31/0224*    (2006.01)
    *H01L 31/024*     (2014.01)
    *G03B 5/00*       (2021.01)
    *H04N 5/225*     (2006.01)
    *G03B 5/02*       (2021.01)
    *G03B 5/04*       (2021.01)
    *G02B 7/182*     (2021.01)
    *H02K 11/21*     (2016.01)
    *G02B 7/09*       (2021.01)
    *G02B 27/64*     (2006.01)
    *G03B 13/36*     (2021.01)
    *H02K 41/035*    (2006.01)
    *G02B 7/00*       (2021.01)
    *H01L 23/00*     (2006.01)
    *G02B 13/00*     (2006.01)

(52) U.S. Cl.
    CPC ............... *H01L 2224/48106* (2013.01); *H01L 2224/48225* (2013.01)

PHOTOSENSITIVE MODULE

CROSS REFERENCE TO RELATED APPLICATIONS

This application claims the benefit of U.S. Provisional Application No. 62/836,405, filed Apr. 19, 2019, the entirety of which are incorporated by reference herein.

BACKGROUND OF THE DISCLOSURE

Field of the Disclosure

The present disclosure relates to a photosensitive module, and in particular it relates to a photosensitive module using a semiconductor embedded substrate (SESUB).

Description of the Related Art

As technology has developed, many of today's electronic devices (such as smartphones) have a camera or video functionality. Using the camera modules disposed on electronic devices, users can operate their electronic devices to capture photographs and record videos.

Generally, the camera module includes a photosensitive module, and the photosensitive module can be made by different packaging technologies. As semiconductor package manufacturing technology advances, the microelectronic assemblies have become smaller, and the circuits within these assemblies have become denser. In order to make the size of the microelectronic assembly smaller, the packaging and assembly of components in the microelectronic assembly must be closer in circuit design. In order to meet the requirements of smaller space and higher density, all components in the microelectronic assembly must be optimized. However, high-density photosensitive modules also generate higher heat.

Therefore, how to design a photosensitive module capable of effectively improving heat dissipation efficiency are topics nowadays that need to be discussed and solved.

BRIEF SUMMARY OF THE DISCLOSURE

Accordingly, one objective of the present disclosure is to provide a photosensitive module to solve the above problems.

According to some embodiments of the disclosure, a photosensitive module is provided and includes a base, an integrated package substrate, and a photosensitive element. The integrated package substrate is connected to the base. The integrated package substrate has a plurality of first electronic components, and the first electronic components are housed inside the integrated package substrate without being exposed to external environment. The photosensitive element is connected to the base, and the photosensitive element is configured to receive a light beam traveling along an optical axis.

According to some embodiments, the integrated package substrate includes a third insulating layer, a fourth insulating layer, an intermediate layer, a first circuit element and a second circuit element. The intermediate layer is disposed between the third insulating layer and the fourth insulating layer, wherein the first electronic component is disposed in the intermediate layer. The first circuit element is disposed between the third insulating layer and the intermediate layer. The second circuit element is disposed between the intermediate layer and the fourth insulating layer, wherein the intermediate layer, the third insulating layer and the fourth insulating layer are made of different materials.

According to some embodiments, the photosensitive module further includes a second electronic component disposed on a surface of the integrated package substrate.

According to some embodiments, the photosensitive module includes a heat dissipation structure, corresponding to the photosensitive element or the integrated package substrate, and the heat dissipation structure is made of a metal material.

According to some embodiments, the photosensitive module further includes a transparent element and a photosensitive element holding frame. The photosensitive element holding frame is connected to the transparent element, wherein a gap is formed between the transparent element and the photosensitive element, and the photosensitive element holding frame is disposed directly on the integrated package substrate.

According to some embodiments, when viewed in a direction perpendicular to the optical axis, the photosensitive element is located between the photosensitive element holding frame and the integrated package substrate.

According to some embodiments, the photosensitive module further includes another integrated package substrate, and the transparent element is connected between the photosensitive element holding frame and the another integrated package substrate.

According to some embodiments, the photosensitive module further includes a circuit assembly, an electrical connection portion and a reinforcing material. The integrated package substrate is electrically connected to the circuit assembly through the electrical connection portion. A reinforcing material is in direct contact with the electrical connection portion, the integrated package substrate and the circuit assembly.

According to some embodiments, the photosensitive module further includes a second electronic component, and the second electronic component and the photosensitive element are disposed on a same side of the integrated package substrate.

According to some embodiments, the photosensitive module further includes a second electronic component, and the second electronic component and the photosensitive element are respectively disposed on different sides of the integrated package substrate.

According to some embodiments, when viewed in a direction perpendicular to the optical axis, at least a portion of the photosensitive element overlaps the integrated package substrate.

According to some embodiments, the photosensitive module further includes a transparent element disposed on the integrated package substrate.

According to some embodiments, when viewed in the direction perpendicular to the optical axis, at least a portion of the integrated package substrate overlaps the transparent element and the photosensitive element.

According to some embodiments, the photosensitive module further includes a heat dissipation structure which is in direct contact with the photosensitive element and base, and when viewed along the optical axis, an area of the heat dissipation structure is smaller than or equal to an area of the photosensitive element.

According to some embodiments, the base includes a body and an electrical connection assembly, and the photosensitive element is electrically connected to the integrated package substrate through the electrical connection assembly.

According to some embodiments, the electrical connection assembly penetrates the body of the base, and the electrical connection assembly is electrically independent of the body.

According to some embodiments, the photosensitive module further includes a heat dissipation structure which is in direct contact with the photosensitive element and the base, and when viewed along the optical axis, an area of the heat dissipation structure is less than or equal to an area of the photosensitive element.

According to some embodiments, the integrated package substrate and the photosensitive element are respectively disposed on opposite sides of the base.

According to some embodiments, the photosensitive element is electrically connected to the integrated package substrate via the base.

According to some embodiments, when viewed in a direction perpendicular to the optical axis, the base, the integrated package substrate, and the photosensitive element do not overlap each other.

The present disclosure provides a photosensitive module that can be installed in various electronic devices. The photosensitive module may include a base, a circuit assembly, an integrated package substrate, and a photosensitive element. The photosensitive element can be electrically connected to the circuit assembly or the integrated package substrate. The integrated package substrate may be a semiconductor embedded substrate (SESUB), which has a plurality of electronic components, and those electronic components are enclosed in the integrated package substrate without being exposed to external environment. Based on the configuration of the integrated package substrate, the photosensitive module can be equipped with more electronic components and can have a smaller volume at the same time.

The base may be made of a material with high thermal conductivity coefficient to improve the overall heat dissipation effect of the photosensitive module. Furthermore, in some embodiments, the photosensitive module may further include a plurality of heat dissipation structures connected to the photosensitive element. The configuration of the heat dissipation structure can improve the heat dissipation efficiency of the photosensitive module.

Additional features and advantages of the disclosure will be set forth in the description which follows, and, in part, will be obvious from the description, or can be learned by practice of the principles disclosed herein. The features and advantages of the disclosure can be realized and obtained by means of the instruments and combinations pointed out in the appended claims. These and other features of the disclosure will become more fully apparent from the following description and appended claims, or can be learned by the practice of the principles set forth herein.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE ILLUSTRATIVE EMBODIMENTS

Figure 1:
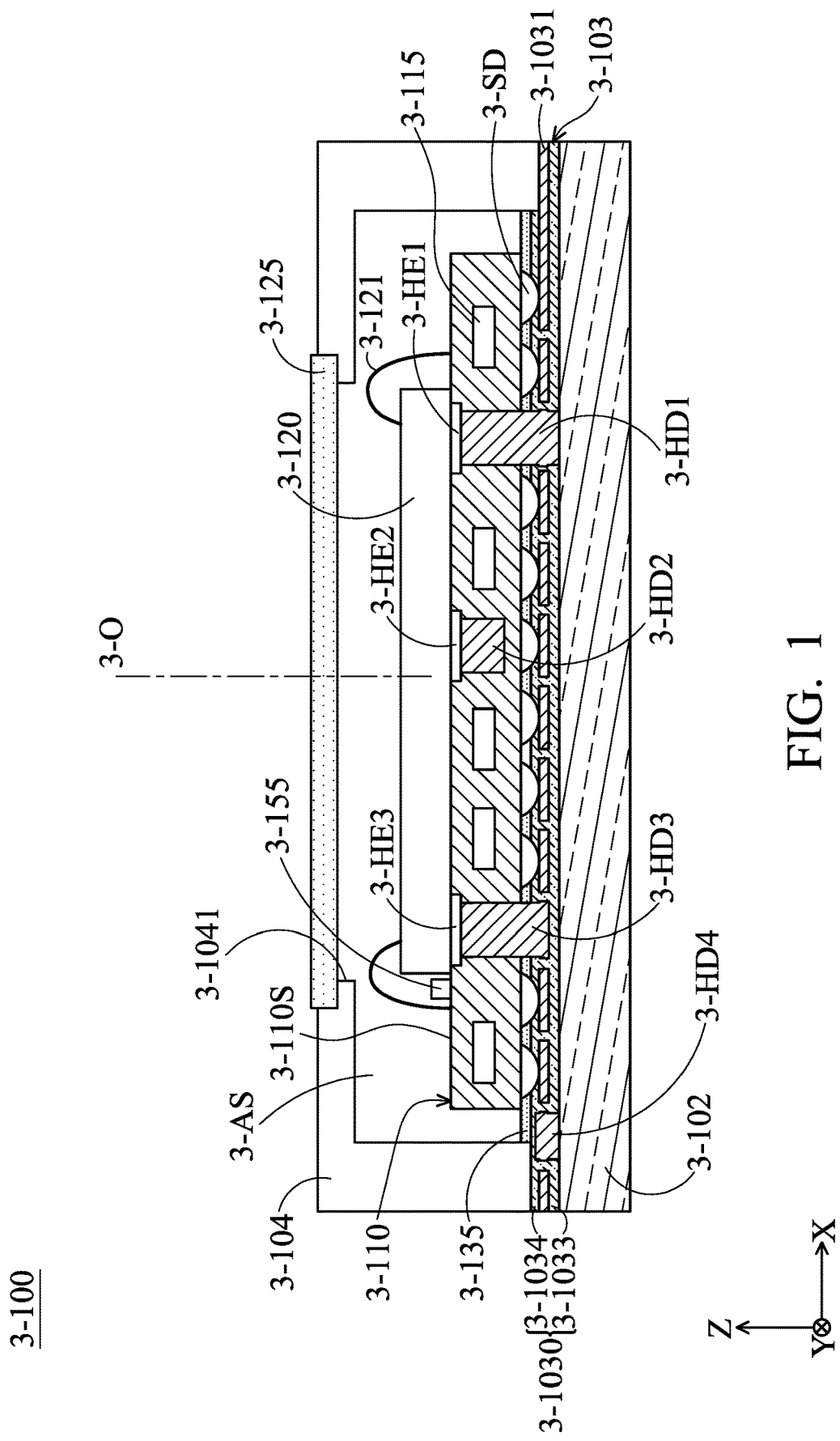
FIG. 1 is a schematic cross-sectional structure diagram of a photosensitive module 3-100 according to an embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

It should be understood that component for specific description or specific figures can be present in any form with which a skilled person is familiar. In addition, when a layer is "above" other layers or a substrate, it might be "directly" on the layers or the substrate, or some other layers may be between the layer and the other layers.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Please refer to FIG. 1, which is a schematic cross-sectional structure diagram of a photosensitive module 3-100 according to an embodiment of the present disclosure. The photosensitive module 3-100 can be installed in various electronic devices, such as a camera of a notebook computer, a camera lens of a tablet computer, or a camera lens of a smart phone. The photosensitive module 3-100 is configured to generate one or more digital image signals after receiving light outside the electronic device.

In this embodiment, as shown in FIG. 1, the photosensitive module 3-100 may include a base 3-102, a circuit assembly 3-103, a photosensitive element holding frame 3-104, an integrated package substrate 3-110, a photosensitive element 3-120, and a transparent element 3-125. The base 3-102 is configured to hold the circuit assembly 3-103, the integrated package substrate 3-110, and the photosensitive element 3-120. In this embodiment, the base 3-102 may be made of a metal material, but it is not limited thereto. Specifically, the base 3-102 may be made of a material with high thermal conductivity.

The circuit assembly 3-103 is fixedly disposed on the base 3-102, and the circuit assembly 3-103 may be a printed circuit board (PCB), but it is not limited thereto. The circuit assembly 3-103 may include an insulating structure layer 3-1030 and a plurality of circuit wires 3-1031, and the circuit wires 3-1031 are disposed in the insulating structure layer 3-1030. These circuit wires 3-1031 are configured to be electrically connected to the integrated package substrate 3-110 or external electronic components. The insulating structure layer 3-1030 may include a first insulating layer 3-1033 and a second insulating layer 3-1034, and the circuit wires 3-1031 are disposed between the first insulating layer 3-1033 and the second insulating layer 3-1034.

The photosensitive element holding frame 3-104 is fixedly disposed on the circuit assembly 3-103, for example, using glue or solder, and the photosensitive element holding frame 3-104 has an opening 3-1041 corresponding to the photosensitive element 3-120. The transparent element 3-125 is disposed on the photosensitive element holding frame 3-104 and covers the opening 3-1041 so as to form an enclosed accommodation space 3-AS for receiving the integrated package substrate 3-110 and the photosensitive element 3-120. The transparent element 3-125 can be an optical filter. For example, it can filter infrared light.

The integrated package substrate 3-110 is disposed on the circuit assembly 3-103, and the photosensitive module 3-100 further includes a plurality of electrical connection portions, and the electrical connection portion may be a solder 3-SD. The integrated package substrate 3-110 is electrically connected to the circuit assembly 3-103 via the solder 3-SD, for example, by the surface-mount technology (SMT). The surface-mount technology may be, for example, a ball grid array (BGA) packaging technology. As shown in FIG. 1, the integrated package substrate 3-110 is connected to the circuit wires 3-1031 through the plurality of solder 3-SD.

Furthermore, the photosensitive module 3-100 may further include a reinforcing material 3-135, which is in direct contact with the electrical connection portion (the solder 3-SD), the integrated package substrate 3-110, and the circuit assembly 3-103. The reinforcing material 3-135 may be a non-conductive adhesive or a head conductive glue, but it is not limited thereto. In some embodiments, the reinforcing material 3-135 and the second insulating layer 3-1034 may be integrally formed. For example, they may be made of a polymer.

The integrated package substrate 3-110 may be a semiconductor embedded substrate (SESUB), but it is not limited thereto. The integrated package substrate 3-110 may have a plurality of first electronic components 3-115, and these first electronic components 3-115 may be various electronic components, such as integrated circuit (IC) chips, capacitors, resistors, sensors, and so on. It should be noted that the first electronic components 3-115 are housed in the body of the integrated package substrate 3-110 without being exposed to external environment.

The photosensitive element 3-120 is disposed on the integrated package substrate 3-110 and is electrically connected to the integrated package substrate 3-110 by a plurality of lead wires 3-121. The photosensitive element 3-120 is configured to receive a light beam traveling along the optical axis 3-O so as to generate a digital image signal.

The photosensitive module 3-100 may include multiple heat dissipation structures and head conductive elements, corresponding to the photosensitive element 3-120 or the integrated package substrate 3-110. The heat conductive element may include an adhesive material with a high thermal conductivity coefficient (such as silver glue or aluminum nitride, etc.), and the heat dissipation structure may have a metal material. As shown in FIG. 1, a first heat conductive element 3-HE1 is disposed on the bottom of the photosensitive element 3-120, and a first heat dissipation structure 3-HD1 is connected to the first heat conductive element 3-HE1 and the base 3-102. Specifically, the first heat dissipation structure 3-HD1 penetrates the integrated package substrate 3-110, the reinforcing material 3-135, and the circuit assembly 3-103 to be connected to the base 3-102, and the first heat dissipation structure 3-HD1 is electrically independent of the integrated package substrate 3-110.

As shown in FIG. 1, a second heat dissipation structure 3-HD2 is connected to a second heat conductive element 3-HE2, the second heat dissipation structure 3-HD2 is embedded in the integrated package substrate 3-110, and the second heat dissipation structure 3-HD2 does not penetrate the integrated package substrate 3-110. A third heat dissipation structure 3-HD3 is connected to a third heat conductive element 3-HE3 and the circuit assembly 3-103, and the third heat dissipation structure 3-HD3 does not penetrate the circuit assembly 3-103. In addition, a fourth heat dissipation structure 3-HD4 is embedded in the circuit assembly 3-103, and based on the configuration of the insulating structure layer 3-1030, the fourth heat dissipation structure 3-HD4 is electrically independent of the circuit wires 3-1031.

Based on the configuration of above-mentioned heat dissipation structures and the heat conductive element, the heat dissipation efficiency of the photosensitive element 3-120 can be improved, so that the stability of the digital image signal generated by the photosensitive element 3-120 can also be improved.

It is worth noting that the above heat dissipation structures are electrically independent of the circuit wires 3-1031. In addition, in some embodiments, the heat conductive elements can be omitted, which means that the photosensitive element 3-120 can be connected to the base 3-102 through the first heat dissipation structure 3-HD1. Furthermore, the integrated package substrate 3-110 is connected to the base 3-102 through the first heat dissipation structure 3-HD1 as well.

Figure 2:
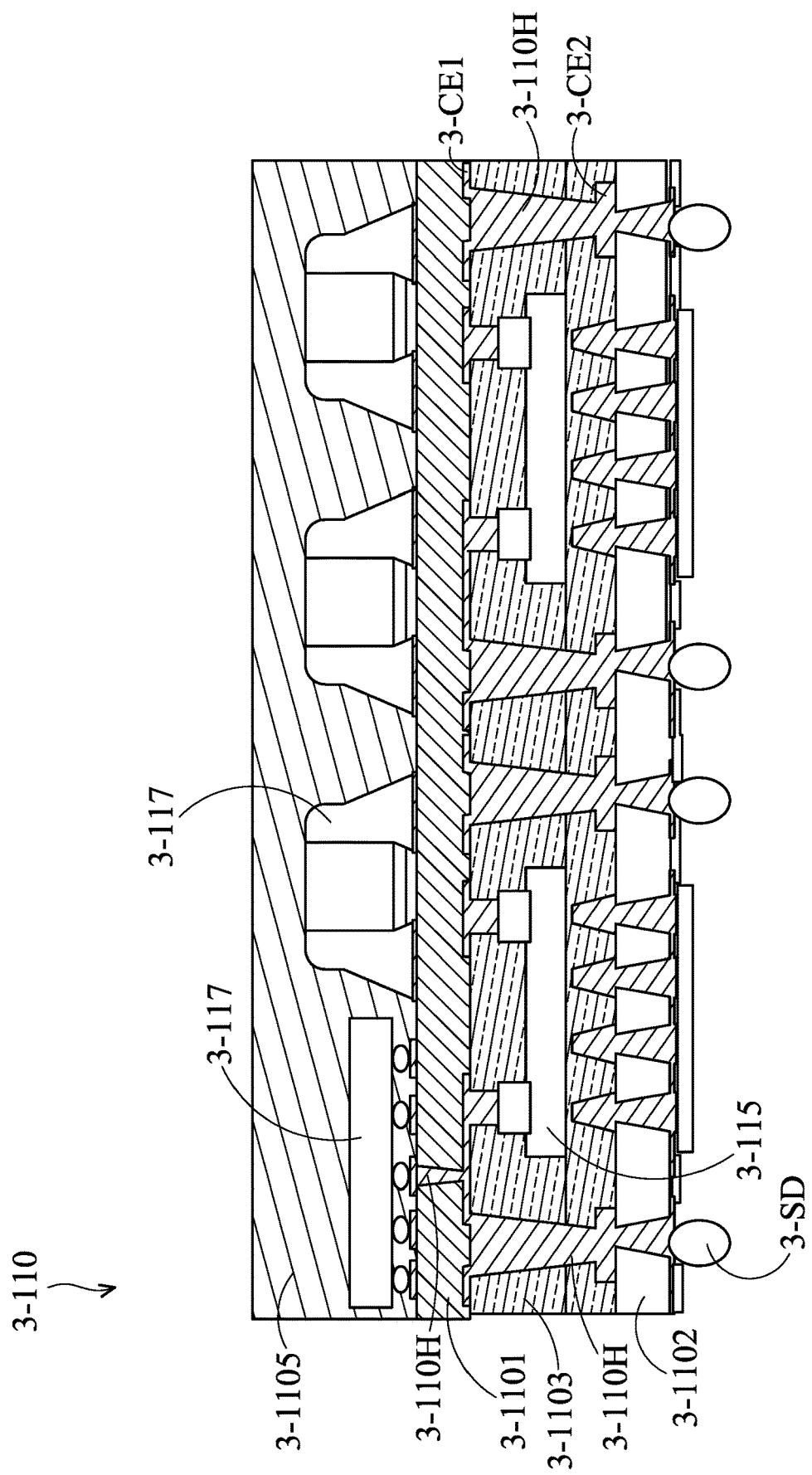
FIG. 2 is an enlarged structural diagram of the integrated package substrate 3-110 according to some embodiments of the present disclosure.

Next, please refer to FIG. 2, which is an enlarged structural diagram of the integrated package substrate 3-110 according to some embodiments of the present disclosure. In this embodiment, the integrated package substrate 3-110 includes a third insulating layer 3-1101, a fourth insulating layer 3-1102, an intermediate layer 3-1103, a first circuit element 3-CE1, and a second circuit element 3-CE2.

The intermediate layer 3-1103 is disposed between the third insulating layer 3-1101 and the fourth insulating layer 3-1102, and the first electronic component 3-115 is disposed in the intermediate layer 3-1103. The first circuit element 3-CE1 is disposed between the third insulating layer 3-1101 and the intermediate layer 3-1103, the second circuit element 3-CE2 is disposed between the intermediate layer 3-1103 and the fourth insulating layer 3-1102, and the intermediate layer 3-1103 is made of a material different from that of the third insulating layer 3-1101 or the fourth insulating layer 3-1102. For example, the material of the intermediate layer 3-1103 is softer than the materials of the third insulating layer 3-1101 and the fourth insulating layer 3-1102.

The first circuit element 3-CE1 and the second circuit element 3-CE2 may be metal pads, which are connected to each other by the through hole 3-110H. In addition, a plurality of electronic units 3-117 (such as integrated circuit wafers) may be disposed on the third insulating layer 3-1101, and the integrated package substrate 3-110 further includes a packaging layer 3-1105 to cover the electronic units 3-117 to prevent them from exposure. The electronic units 3-117 may be electrically connected to the solder 3-SD through the plurality of through holes 3-110H, the first circuit element 3-CE1 and the second circuit element 3-CE2.

Please return to FIG. 1 again. In this embodiment, the photosensitive module 3-100 further includes a second electronic component 3-155 disposed on a surface 3-110S of the integrated package substrate 3-110. It is worth noting that the second electronic component 3-155 and the photosensitive element 3-120 are disposed on the same side of the integrated package substrate 3-110.

Figure 3:
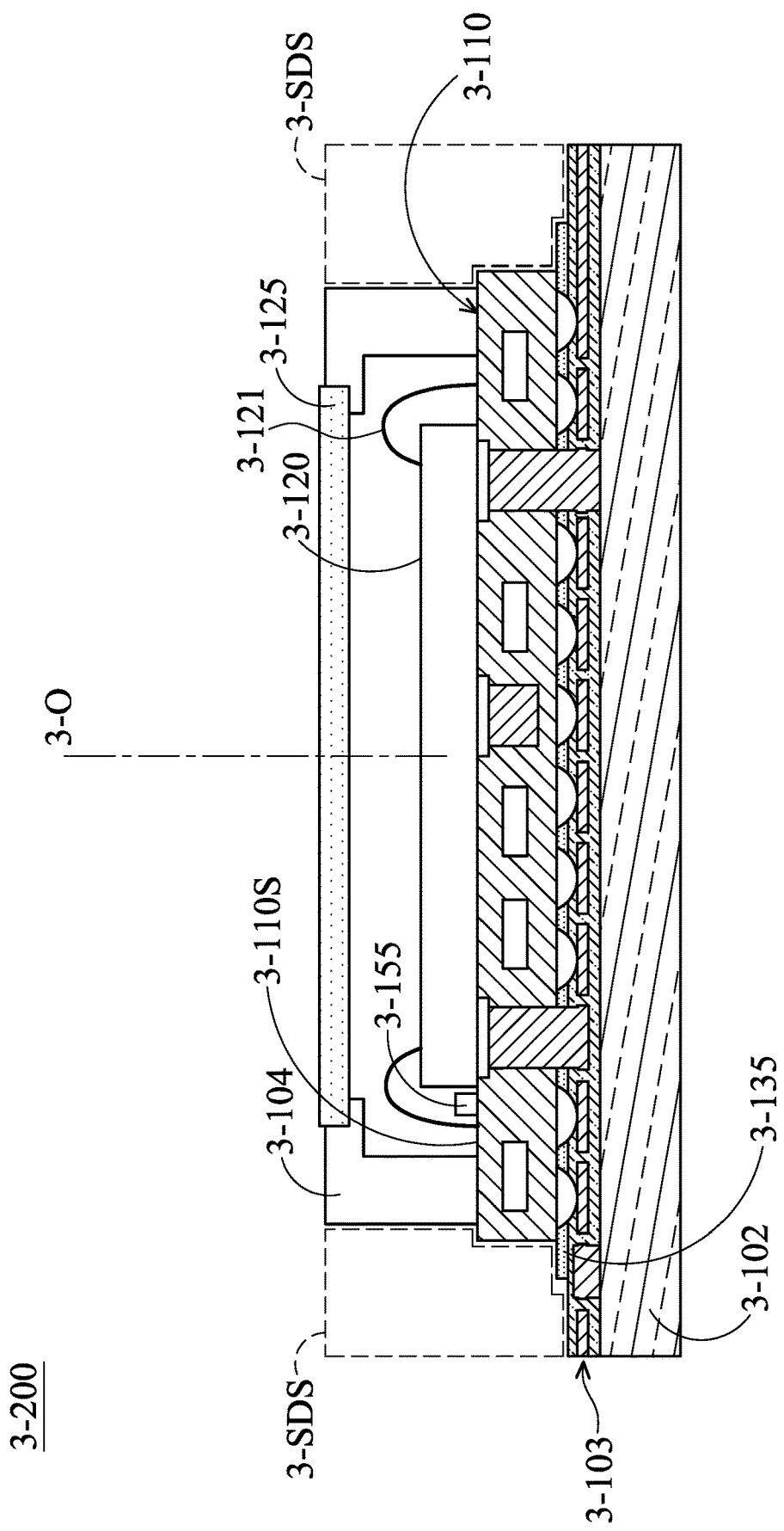
FIG. 3 is a schematic cross-sectional structure diagram of a photosensitive module 3-200 according to another embodiment of the present disclosure.

Please refer to FIG. 3, which is a schematic cross-sectional structure diagram of a photosensitive module 3-200 according to another embodiment of the present disclosure. The structure of the photosensitive module 3-200 is similar to that of the photosensitive module 3-100, and the same components will not be described repeat herein. In this embodiment, the photosensitive element holding frame 3-104 is disposed on the surface 3-110S of the integrated package substrate 3-110.

Based on the above structural configuration, the amount of usable space of the sensitive module 3-200 can be increased. For example, as shown in FIG. 3, when the photosensitive module 3-200 is connected to a camera lens driving mechanism (not shown in the figures), at least one side space 3-SDS around the photosensitive element holding frame 3-104 can be used to dispose components of the camera lens driving mechanism so as to improve the space utilization rate.

Figure 4:
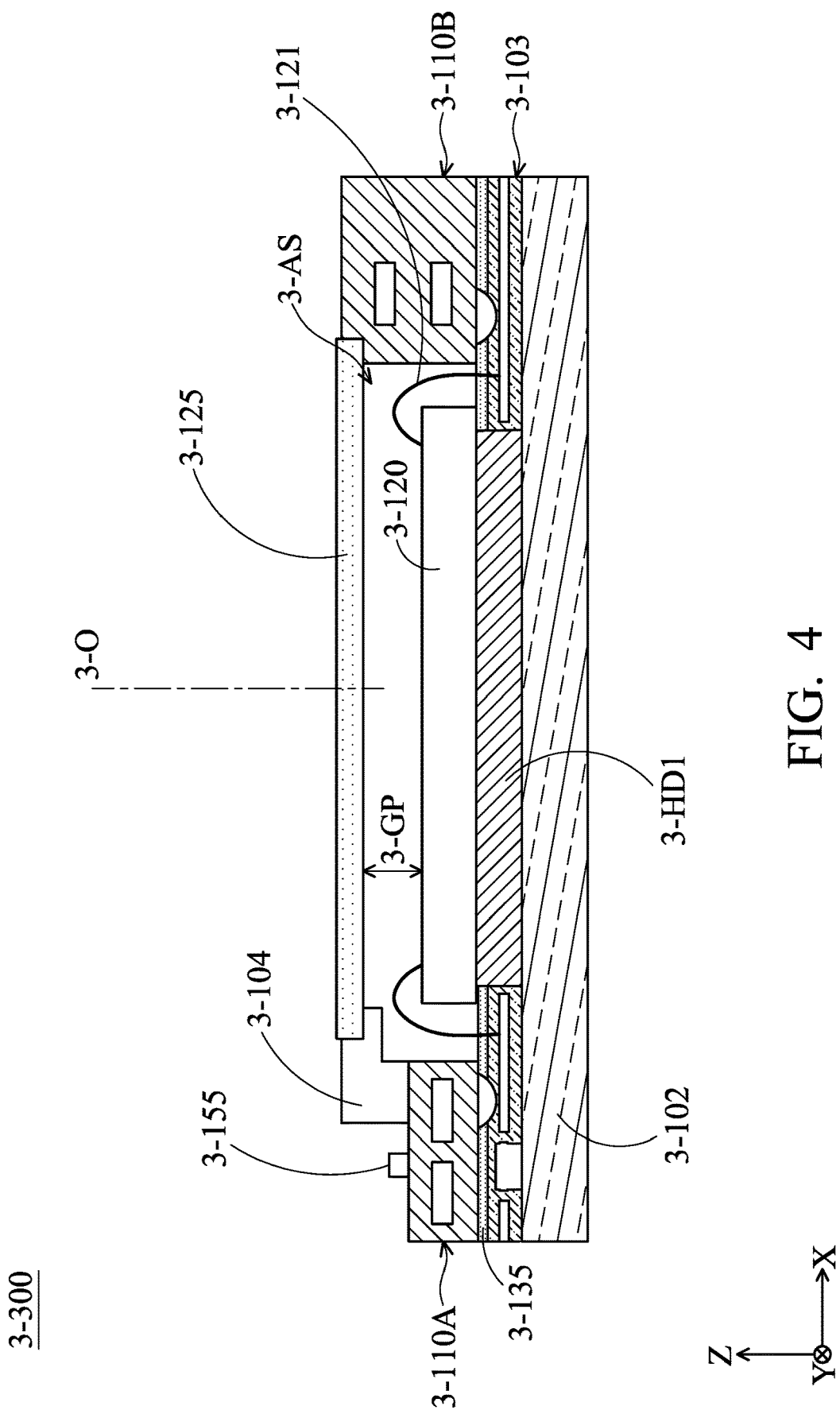
FIG. 4 is a schematic cross-sectional structure diagram of a photosensitive module 3-300 according to another embodiment of the present disclosure.

Please refer to FIG. 4, which is a schematic cross-sectional structure diagram of a photosensitive module 3-300 according to another embodiment of the present disclosure. In this embodiment, the photosensitive module 3-300 includes a first integrated package substrate 3-110A and a second integrated package substrate 3-110B, which are disposed on opposite sides of the photosensitive element 3-120.

The photosensitive element holding frame 3-104 is directly disposed on the first integrated package substrate 3-110A and is connected to one end of the transparent element 3-125, and the other end of the transparent element 3-125 is disposed on the second integrated package substrate 3-110B. That is, the transparent element 3-125 is connected between the photosensitive element holding frame 3-104 and the second integrated package substrate 3-110B.

In this embodiment, a gap 3-GP formed between the transparent element 3-125 and the photosensitive element 3-120. Specifically, the first integrated package substrate 3-110A, the second integrated package substrate 3-110B, the photosensitive element holding frame 3-104 and the transparent element 3-125 form an enclosed accommodation space 3-AS, and the photosensitive element 3-120 is disposed in the accommodation space 3-AS.

When viewed in a direction perpendicular to the optical axis 3-O (for example, along the X-axis), the photosensitive element 3-120 is located between the photosensitive element holding frame 3-104 and the second integrated package substrate 3-110B. When viewed along the direction perpendicular to the optical axis 3-O (for example, the X-axis), at least a portion of the photosensitive element 3-120 overlaps the first integrated package substrate 3-110A or the second integrated package substrate 3-110B. Furthermore, when viewed along the direction perpendicular to the optical axis 3-O, at least a portion of the second integrated package substrate 3-110B overlaps the transparent element 3-125 and the photosensitive element 3-120.

In addition, as shown in FIG. 4, the photosensitive module 3-300 includes a heat dissipation structure (the first heat dissipation structure 3-HD1), which is in direct contact with the photosensitive element 3-120 and base 3-102, and when viewed along the optical axis 3-O, the area of the first heat dissipation structure HD1 is slightly smaller than or equal to the area of the photosensitive element 3-120. For example, the area of the first heat dissipation structure 3-HD1 may be 80 to 100% of that of the photosensitive element 3-120, so that the efficiency of heat dissipation of the photosensitive element 3-120 may be increased.

Figure 5:
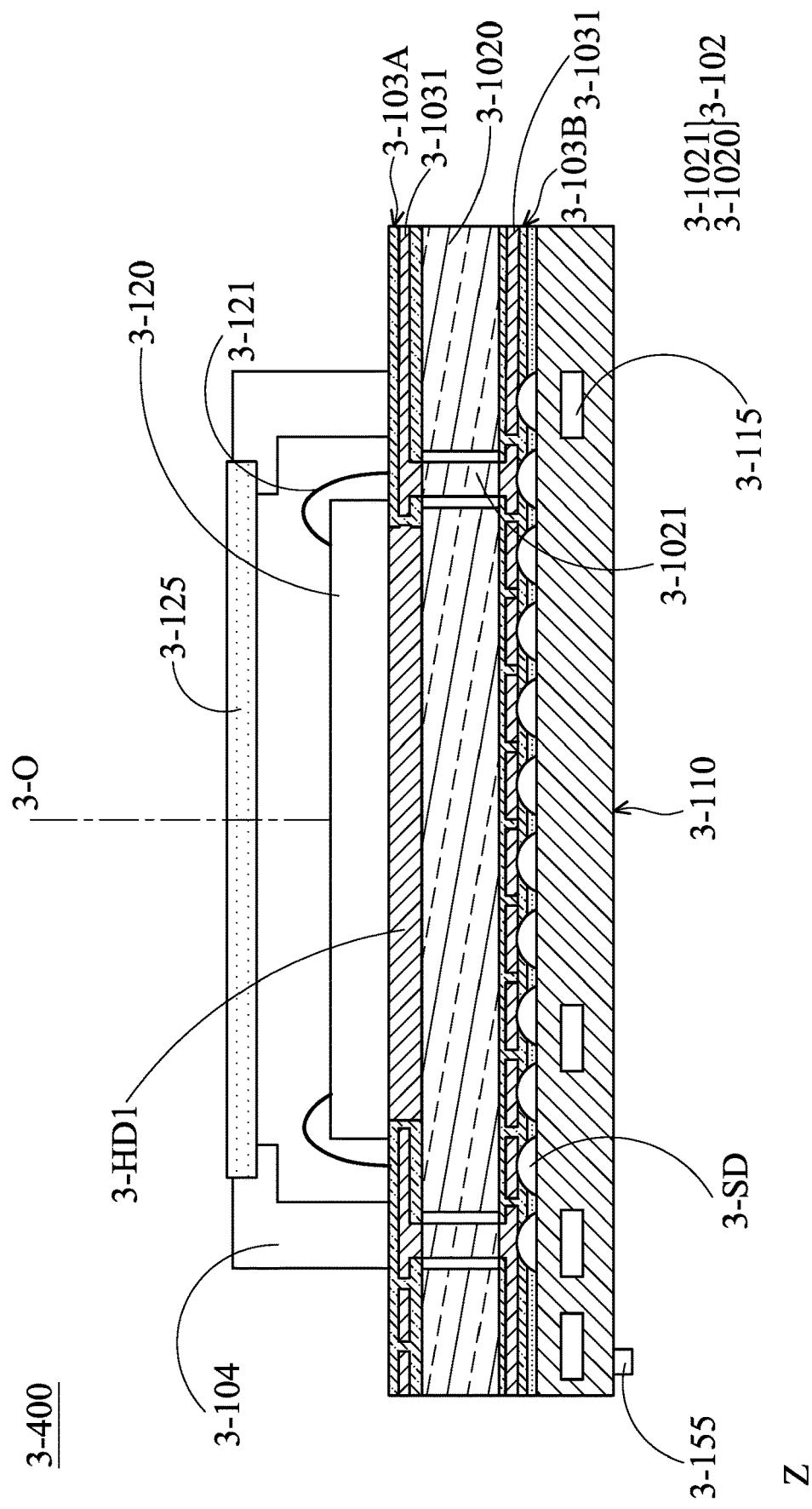
FIG. 5 is a schematic cross-sectional structure diagram of a photosensitive module 3-400 according to another embodiment of the present disclosure.

Please refer to FIG. 5, which is a schematic cross-sectional structure diagram of a photosensitive module 3-400 according to another embodiment of the present disclosure. In this embodiment, the integrated package substrate 3-110 and the photosensitive element 3-120 are respectively disposed on opposite sides of the base 3-102. Furthermore, the second electronic component 3-155 and the photosensitive element 3-120 are respectively disposed on different sides of the integrated package substrate 3-110.

In this embodiment, the photosensitive module 3-400 includes two circuit assemblies (the circuit assemblies 3-103A, 3-103B), which are disposed on opposite sides of the base 3-102. The photosensitive element 3-120 is disposed on the circuit assembly 3-103A, and the integrated package substrate 3-110 is disposed on the bottom of the circuit assembly 3-103B.

In this embodiment, the photosensitive element 3-120 is electrically connected to the integrated package substrate 3-110 via the base 3-102. Specifically, the base 3-102 further includes a body 3-1020 and at least one electrical connection assembly 3-1021, and the photosensitive element 3-120 is electrically connected to the integrated package substrate 3-110 through the circuit assembly 3-103A, the electrical connection assembly 3-1021, and the circuit assembly 3-103B.

It is worth noting that the electrical connection assembly 3-1021 penetrates the body 3-1020 of the base 3-102, and the electrical connection assembly 3-1021 is electrically independent of the body 3-1020 of the base 3-102. In addition, when viewed along the direction perpendicular to the optical axis 3-O (for example, the X-axis), the base 3-102, the integrated package substrate 3-110, and the photosensitive element 3-120 do not overlap each other.

Similar to the photosensitive module 3-300, the first heat dissipation structure 3-HD1 of the photosensitive module 3-400 also is in direct contact with the photosensitive element 3-120 and the base 3-102, and when viewed along the optical axis 3-O, the area of the first heat dissipation structure 3-HD1 is less than or equal to the area of the photosensitive element 3-120.

The present disclosure provides a photosensitive module that can be installed in various electronic devices. The photosensitive module may include a base 3-102, a circuit assembly 3-103, an integrated package substrate 3-110, and a photosensitive element 3-120. The photosensitive element 3-120 can be electrically connected to the circuit assembly 3-103 or the integrated package substrate 3-110. The integrated package substrate 3-110 may be a semiconductor embedded substrate (SESUB), which has a plurality of electronic components, and those electronic components are enclosed in the integrated package substrate 3-110 without being exposed to external environment. Based on the configuration of the integrated package substrate 3-110, the photosensitive module can be equipped with more electronic components and can have a smaller volume at the same time.

The base 3-102 may be made of a material with high thermal conductivity coefficient to improve the overall heat dissipation effect of the photosensitive module. Furthermore, in some embodiments, the photosensitive module may further include a plurality of heat dissipation structures connected to the photosensitive element 3-120. The configuration of the heat dissipation structure can improve the heat dissipation efficiency of the photosensitive module.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A photosensitive module, comprising:
    a base;
    an integrated package substrate, connected to the base, wherein the integrated package substrate has a plurality of first electronic components, and the first electronic components are housed inside the integrated package substrate without being exposed to external environment; and
    a photosensitive element, connected to the base, wherein the photosensitive element is configured to receive a light beam traveling along an optical axis;
    wherein the integrated package substrate includes:
    a third insulating layer;
    a fourth insulating layer;
    an intermediate layer, disposed between the third insulating layer and the fourth insulating layer, wherein the first electronic components are disposed in the intermediate layer;
    a first circuit element, disposed between the third insulating layer and the intermediate layer; and
    a second circuit element, disposed between the intermediate layer and the fourth insulating layer, wherein the intermediate layer, the third insulating layer and the fourth insulating layer are made of different materials;
    wherein when viewed in a direction perpendicular to the optical axis, at least a portion of the photosensitive element overlaps the integrated package substrate;
    wherein the photosensitive module further includes a transparent element disposed on the integrated package substrate;
    wherein when viewed in the direction perpendicular to the optical axis, at least a portion of the integrated package substrate overlaps the transparent element and the photosensitive element;
    wherein the photosensitive module further includes a heat dissipation structure which is in direct contact with the photosensitive element and the base, and when viewed along the optical axis, an area of the heat dissipation structure is smaller than or equal to an area of the photosensitive element.

2. The photosensitive module as claimed in claim 1, wherein the photosensitive module further includes a second electronic component disposed on a surface of the integrated package substrate.

3. The photosensitive module as claimed in claim 1, wherein the heat dissipation structure corresponds to the photosensitive element or the integrated package substrate, and the heat dissipation structure is made of a metal material.

4. The photosensitive module as claimed in claim 1, wherein the photosensitive module further includes:
    a photosensitive element holding frame, connected to the transparent element, wherein a gap is formed between the transparent element and the photosensitive element, and the photosensitive element holding frame is disposed directly on the integrated package substrate.

5. The photosensitive module as claimed in claim 4, wherein when viewed in a direction perpendicular to the optical axis, the photosensitive element is located between the photosensitive element holding frame and the integrated package substrate.

6. The photosensitive module as claimed in claim 5, wherein the photosensitive module further includes another integrated package substrate, and the transparent element is connected between the photosensitive element holding frame and the another integrated package substrate.

7. The photosensitive module as claimed in claim 1, wherein the photosensitive module further includes:
    a circuit assembly;
    an electrical connection portion, wherein the integrated package substrate is electrically connected to the circuit assembly through the electrical connection portion; and
    a reinforcing material, in direct contact with the electrical connection portion, the integrated package substrate and the circuit assembly.

8. The photosensitive module as claimed in claim 1, wherein the photosensitive module further includes a second electronic component, and the second electronic component and the photosensitive element are disposed on a same side of the integrated package substrate.

9. The photosensitive module as claimed in claim 1, wherein the photosensitive module further includes a second electronic component, and the second electronic component and the photosensitive element are respectively disposed on different sides of the integrated package substrate.

10. The photosensitive module as claimed in claim 1, wherein the base includes a body and an electrical connection assembly, and the photosensitive element is electrically connected to the integrated package substrate through the electrical connection assembly.

11. The photosensitive module as claimed in claim 10, wherein the electrical connection assembly penetrates the body of the base, and the electrical connection assembly is electrically independent of the body.

12. The photosensitive module as claimed in claim 1, wherein the integrated package substrate and the photosensitive element are respectively disposed on opposite sides of the base.

13. The photosensitive module as claimed in claim 12, wherein the photosensitive element is electrically connected to the integrated package substrate via the base.

* * * * *